United States Patent
Huh et al.

[11] Patent Number: 5,622,636
[45] Date of Patent: Apr. 22, 1997

[54] ETCH-ENDING POINT MEASURING METHOD FOR WET-ETCH PROCESS

[75] Inventors: Yun J. Huh, Cheongju-si; Sang J. Choi, Seoul; Suk B. Han, Cheongju-si, all of Rep. of Korea

[73] Assignee: LG Semicon Co., Ltd., Chungcheongbuk-do, Rep. of Korea

[21] Appl. No.: 646,143

[22] Filed: May 7, 1996

[30] Foreign Application Priority Data

Dec. 26, 1995 [KR] Rep. of Korea .................. 56310/1995

[51] Int. Cl.$^6$ .................................................. H01L 21/311
[52] U.S. Cl. ............................... 438/5; 205/645; 216/84
[58] Field of Search .......................... 156/626.1; 216/84, 216/86; 205/645

[56] References Cited

U.S. PATENT DOCUMENTS

| | | | |
|---|---|---|---|
| 3,723,062 | 3/1973 | Dahms | 23/230 R |
| 4,998,021 | 3/1991 | Mimasaka | 250/560 |
| 5,016,663 | 5/1991 | Mase et al. | 134/1 |
| 5,338,390 | 8/1994 | Barbee et al. | 156/627 |
| 5,364,510 | 11/1994 | Carpio | 204/153.1 |
| 5,500,073 | 5/1995 | Barbee et al. | 156/345 |
| 5,503,707 | 9/1995 | Maung et al. | 156/626.1 |

*Primary Examiner*—Robert Kunemund
*Assistant Examiner*—Michael E. Adjodha
*Attorney, Agent, or Firm*—Morgan, Lewis and Bockius LLP

[57] ABSTRACT

A wet-etch method which determines a desired etch-ending point includes the steps of providing an etchant solution in a bath, perform a wet-etch process by dipping a material to be etched in the bath, measuring a PH variation value of the etchant solution during the wet-etch process, calculating a thickness variation value of the material by using the measured PH variation value, and stopping the wet-etch process when the thickness variation value reaches a preset value.

24 Claims, 1 Drawing Sheet

F I G.1
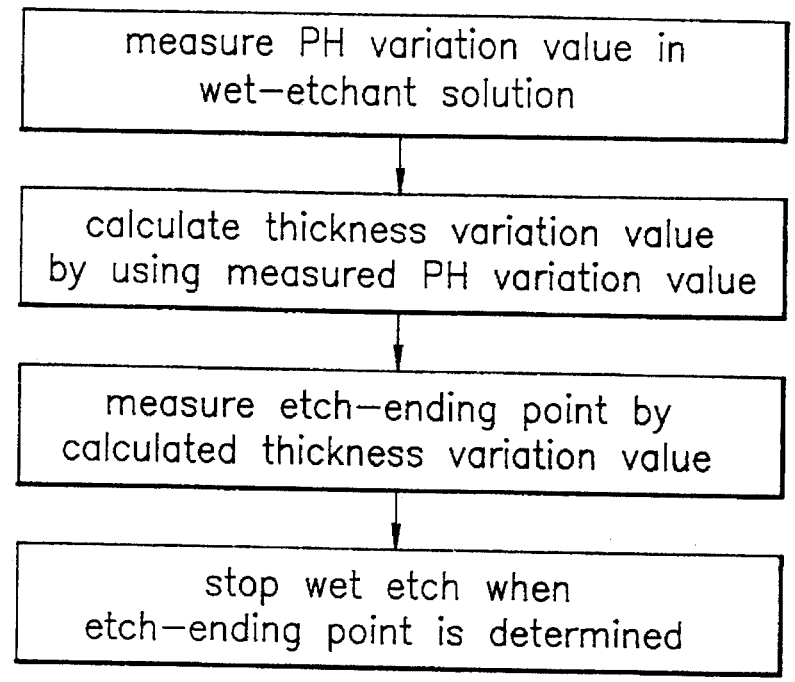
F I G.2
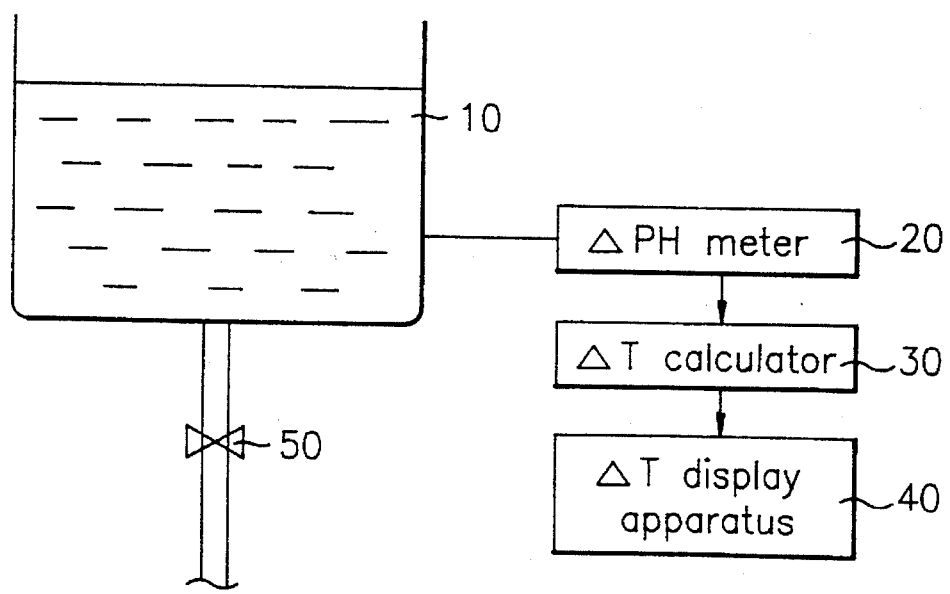

ETCH-ENDING POINT MEASURING METHOD FOR WET-ETCH PROCESS

BACKGROUND OF THE INVENTION

1. Field of the Invention

The present invention relates to a method for measuring an etch-ending point, and more particularly, to a method for measuring an etch-ending point during a wet etch process.

2. Discussion of the Related Art

An etching process is usually carried out for forming a variety of patterns during a semiconductor device manufacturing process. It can be used to etch a semiconductor layer, an insulating layer, or a conductive layer. Conventionally, etching processes are classified into processes using either a dry etch method or a wet etch method.

For both the dry etch and the wet etch methods, one important factor is the ability to decide when a layer subjected to etching has been etched to the desired thickness. In order to assure the success of the semiconductor device manufacturing process which requires minute patterns, it is essential to be able to decide accurately when each of the layers subjected to etching has been etched to the desired thickness during the etch process for forming the respective patterns. In other words, it is essential to accurately measure an etch-ending point during an etch process.

The conventional methods for measuring an etch-ending point will now be described for both the dry etch process and the wet etch process.

For the dry etch process, the widely adopted etch-ending point measuring method is a light wavelength method. When the dry etch of a silicon oxide layer ($SiO_2$) is performed by using an etchant $CF_4$, the etchant $CF_4$ reacts to the silicon oxide layer to produce a by-product such as $CO_yF_x$. A light beam, such as laser, is then projected upon the silicon oxide layer which is reacting with the etchant $CF_4$. When the light is reflected from the silicon oxide layer and the by-product resulting from the reaction, the intensity of the reflected light at specific wavelengths will vary in accordance with the degree of etching completed of the silicon oxide layer. The intensity of the reflected light at a specific wavelength is measured during the etch process and compared to a certain pre-determined intensity value set by prior experiments. Thus, when the measured intensity of the light is equal to the pre-determined intensity value, the etch-ending point has been reached.

The above described light wavelength method for measuring the etch-ending point is also used in conventional chemical-mechanical polishing (CMA) process. The CMA process etches a layer to a desired thickness by milling the layer subjected to the etch process.

For the wet etch process, three conventional methods for measuring the etch-ending point are often used. For the purpose of discussion, it is assumed that an insulating layer is wet-etched to form a desired pattern in a structure having the insulating layer on a semiconductor layer.

The first method is a color method. After putting this structure into a bath filled with an etchant and conducting the wet etch for a period of time, the resultant structure is taken out of the bath to determine the etch-ending point by examining the surface color of the resultant structure. If the insulating layer is etched to the desired thickness, the surface color of the structure would differ from that before conducting the etch, because the color of the underlying semiconductor layer is different from that of the insulating layer.

This color method is mainly used in a partial etch process. For example, it is used when the insulating layer is etched a thickness of 4000Å–5000Å only.

The second method is a surface tension method. A structure comprised of a semiconductor layer, such as silicon, and an insulating layer is put in a bath filled with a wet-etchant and subjected to the wet etch. Then, the resultant structure is taken out of the bath and the surface is sprayed with water. If the insulating layer is thoroughly etched, the surface of the silicon would be exposed. Accordingly, the silicon surface may be slightly stained with the water due to the surface tension of the silicon. If the insulating layer is not thoroughly etched, the sprayed water does not adhere to the surface, instead it flows over the surface. Thus, the etch-ending point can be measured.

The third method for determining the etch-ending point uses a thickness meter. Initially, a structure comprised of a semiconductor layer and an insulating layer is put into the bath and subjected to the wet etch for a period of time. Then, the resultant structure is taken out of the bath, and the thickness of the structure is measured by using a thickness meter. If the insulating layer is thoroughly etched, the measured thickness of the structure equals the thickness of the semiconductor layer. If the insulating layer is not thoroughly etched, the measured thickness of the structure would be larger than the thickness of the semiconductor layer.

All three etch-ending point measuring methods for the wet etch process are visual methods, which can be difficult to apply when the structure has patterns. Since the etch process employed for manufacturing semiconductor devices is frequently used to form patterns, and the patterns are often of a minute nature, it is almost impossible to visually measure the etch-ending point under those circumstances.

Conventionally, in order to actually apply the above-described methods during the manufacturing process of the semiconductor devices, a test pattern with an enlarged configuration is utilized. In other words, the same manufacturing process is simultaneously performed upon the pattern when the process is used to manufacture the semiconductor devices. The test pattern is a considerable enlargement of the actual structure, so that the above three etch-ending point measuring methods can be applied. The etch-ending point of the actual structure can be only estimated by using the color, surface tension, and thickness of the test pattern.

This technique of using the etch-ending point on the test pattern to provide an estimation for the etch-ending point of the actual structure has several problems. First, it has an inherent risk of inaccuracy of the etch-ending point for the actual structure, and such inaccuracy usually causes failures of the manufacturing process.

In addition, due to the large size of the test pattern involved and the large amount of the chemical material (such as the etchants) required, the whole manufacturing process becomes very complicated and expensive.

Furthermore, the structure is taken out of the bath one by one to either determine the color and surface tension, or measure the thickness with the meter, thereby increasing the processing time.

Therefore, the conventional etch-ending point measuring methods for the wet etch process are not as effective in various aspects as the measuring method for the dry etch process. However, during the manufacturing process of the semiconductor devices, it is well known that the wet etch is preferred to the dry etch under certain circumstances. Consequently, an effective etch-ending point measuring method for the wet etch process is needed.

SUMMARY OF THE INVENTION

Accordingly, the present invention is directed to an etch-ending point measuring method that substantially obviates one or more of the problems, limitations, and disadvantages of the related art.

An object of the present invention is to provide an etch-ending point measuring method with reduced risk of failure and lower financial cost. Another object of the present invention is to provide an etch-ending point measuring method which can be performed within a shorter period of time compared to the conventional method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the etch-ending point measuring method of the present invention includes the steps of providing an etchant solution into the bath for putting a material subjected to the etch in the bath to perform the wet-etch operation, measuring a PH variation amount of the material in the etchant solution while the wet etch is performed, calculating a thickness variation amount of the material to be etched by means of the measured PH variation amount, and determining a state that the calculated thickness variation amount reaches a preset thickness variation value as an etch-ending point.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1 is a block diagram showing an etch-ending point measuring method for a wet etch process according to the present invention; and FIG. 2 is a schematic construction view showing a wet-etch apparatus for embodying the etch-ending point measuring method according to the present invention.

DETAILED DESCRIPTION OF THE PREFERRED EMBODIMENTS

Reference will now be made in detail to the preferred embodiments of the present invention, examples of which are illustrated in the accompanying drawings.

As described above, during the manufacturing process of a semiconductor device, a semiconductor layer, an insulating layer, or a conductive layer of a metal is usually subjected to a wet etch process.

In the present invention, hydrogen fluoride (HF), $H_3PO_4$, $NH_4OH$ or $H_2SO_4$ can be used as a wet-etchant. One common characteristic of all the wet-etchants listed above is their capability of releasing hydrogen ions ($H_+$). The hydrogen ions are formed in the etchant solution during the wet-etch process.

According to the present invention, as shown in the process of FIG. 1, the hydrogen ion density is used for measuring a PH variation value ($\Delta PH$) of the etchant solution, and the measured PH variation value $\Delta PH$ is then used to calculate a thickness variation value (or etched thickness value) $\Delta T$ of the material being etched. Finally, the calculated thickness variation value $\Delta T$ is used to determine the etch-ending point.

A first embodiment of the present invention will now be described in detail with reference to FIGS. 1 and 2. In this first embodiment, the material to be etched is an insdicting layer, and it could be either a silicon oxide layer ($SiO_2$) or a silicon nitride layer ($Si_3N_4$). To simplify the discussion, we will assume the insulating layer is a $SiO_2$ layer.

FIG. 2 is a schematic diagram showing the construction of a wet-etch apparatus embodying the etch-ending point measuring method according to the present invention. In FIG. 2, a reference numeral 10 denotes a bath for retaining the wet-etchant solution; 20 is a $\Delta PH$ meter; 30 is a $\Delta T$ calculator; 40 is a $\Delta T$ display apparatus (a general monitor may be employed as the display apparatus); and 50 is a valve for controlling the supply of the wet-etchant solution.

Initially, a hydrogen fluoride (HF) solution used as the wet-etchant solution is filled in the bath 10 via the valve 50, and the silicon oxide layer (as the insulating layer to be etched) is dipped into the bath 10. The process of wet-etching the silicon oxide layer using the HF solution is expressed as the following reaction formula:

$$SiO_2 + 6HF \rightleftharpoons 2H^+ + SiF_6^{--} + 2H_2O \qquad (1)$$

In accordance with the reaction formula (1), when the silicon oxide layer of 1 mole reacts, the hydrogen ion of 2 mole ($2H^+$) remains in the solution. By using the above relation, an etch rate, i.e., the thickness variation value $\Delta T$ of the silicon oxide layer, is calculated via the $\Delta T$ calculator 30 by utilizing the PH variation value $\Delta PH$.

The PH value in the etchant solution changes during the wet etch process, resulting a changing $\Delta PH$ value in accordance with the etch rate of the silicon oxide layer. As shown in reaction formula (1), the hydrogen ion ($H^+$) generally reacts to fluoride (F) to form an $HF_2^-$ ion or remains unchanged in the etchant solution during the wet etch process. The PH value stops changing after the etch-ending point is reached because the reaction in accordance with the reaction formula (1) stops when the desired etching of the silicon oxide layer is completed and the surface of a silicon substrate is exposed. At this stage, the hydrogen ion ($H^+$) serves the purpose of passivating the surface of the silicon substrate.

During the wet etch process, $\Delta PE$ meter 20 is employed for measuring the PH variation value $\Delta PH$ in the etchant solution within the bath 10, and the value $\Delta PH$ is then used by the $\Delta T$ calculator 30 to calculate the thickness variation value $\Delta T$ of the silicon oxide layer. The calculation process will now be described.

First, the PH value is defined $$PH = -\log (\text{density of } H+) \qquad (2)$$

where, $H^+$ denotes the hydrogen ion.

A density $\Delta H$ of the changed hydrogen ion (i.e., a density variation value of $H^+$) can be calculated according to the following equation:

$$\Delta H=10^{-\Delta ph} \text{ (mole/cm}^3\text{)} \quad (3)$$

Since the hydrogen ion of 2 mole is produced from the reaction of the silicon oxide layer of 1 mole according to the reaction formula (1), the density variation value of the etched silicon oxide become $\Delta H/2$.

The $\Delta T$ calculator 30 then calculates the thickness variation value $\Delta T$ of the silicon oxide layer using the following formula:

$$\Delta T = \Delta H/2 \times M \times V \times 1/\rho \times 1/A \quad (4)$$

where M denotes a molecular weight of the silicon oxide, V is a volume of the wet-etchant solution, $\rho$ is the density of the silicon oxide, and A is an open area of the silicon oxide layer to be etched.

During the etching process, the $\Delta T$ display apparatus 40 continuously or discretely displays the $\Delta T$ value for that particular moment. When the displayed $\Delta T$ value reaches a predetermined value corresponding to the etch-ending point, the wet-etch process is completed.

A second embodiment of the present invention will now be described, and the material subjected to the wet-etch in the second embodiment is a semiconductor, i.e., a polysilicon. It is assumed that the polysilicon is formed on an insulating substrate.

Initially, a hydrogen fluoride solution and a nitric acid ($HNO_3$) solution are filled in the bath 10 via the valve 50 as the wet-etchant solution, and the polysilicon layer to be etched is then dipped into the bath 10.

The process of wet-etching the polysilicon using the hydrogen fluoride and nitric acid is expressed as the following reaction formula:

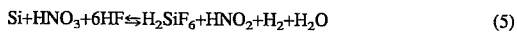
$$Si+HNO_3+6HF \rightleftharpoons H_2SiF_6+HNO_2+H_2+H_2O \quad (5)$$

In accordance with the reaction formula (5), when the polysilicon (Si) of 1 mole reacts to the etchant solution, the hydrogen ion (H+) of about 3 mole is left in the solution. In other words, the hydrogen ion of 7 mole before the reaction becomes the hydrogen ion of 3 mole after the reaction.

Because the mole-change of the hydrogen ion in the solution, the PH value of the etchant solution changes during the wet etch of the polysilicon. The reaction in accordance with the reaction formula (5) stops when the desired etching of the polysilicon is completed and the surface of the underlying insulating substrate is exposed.

As shown in FIG. 2, the $\Delta PH$ meter 20 measures the variation value $\Delta PH$ within the bath 10 during the wet etch, and the $\Delta T$ calculator 30 calculates the density value $\Delta H$ of the changed hydrogen ion ($H^+$) in the etchant solution by using the PH variation value $\Delta PH$.

Since a hydrogen ion of 3 mole is left by the reaction of the polysilicon of 1 mole according to the reaction formula the density variation value of the polysilicon becomes $\Delta H/3$. The thickness variation value (or etched thickness) $\Delta T$ of the polysilicon can then be calculated as the following:

$$\Delta T = \Delta H/3 \times M \times V \times 1/\rho \times 1/A \quad (6)$$

where M denotes a molecular weight of the polysilicon, V is a volume of the wet-etchant solution, $\rho$ is the density of the polysilicon, and A is an open area of the polysilicon to be etched.

During the wet etching of the polysilicon, the $\Delta T$ display apparatus 40 continuously or discretely displays the $\Delta T$ value for that particular moment, and the wet-etching process is stopped when the $\Delta T$ value displayed via the display apparatus 40 reaches the desired value.

The present invention has the following advantages. First, since the present invention is an automatic etch-ending point measuring method, instead of a visual measuring method, it allows the wet etching process to be performed within a shorter period of time than the conventional methods.

Second, the present invention is cost effective because an enlarged test pattern is not required. This prevents unnecessary consumption of the chemical solution and the etch material.

Third, the etch-ending point is more accurately measured in the present invention than the conventional methods, thus preventing possible failures during the wet etch.

It will be apparent to those skilled in the art that various modifications and variations can be made in the etch-ending point measuring method of the present invention without departing from the spirit or scope of the invention. Thus, it is intended that the present invention cover the modifications and variations of this invention provided they come within the scope of the appended claims and their equivalents.

What is claimed is:

1. A wet-etching method which determines a desired etch-ending point comprising the steps of:
   providing an etchant solution in a bath;
   perform a wet-etch process by dipping a material to be etched in the bath;
   measuring a PH variation value of the etchant solution during the wet-etch process;
   calculating a thickness variation value of the material by using the measured PH variation value; and
   stopping the wet-etch process when the thickness variation value reaches a preset value.

2. The wet-etching method as claimed in claim 1, wherein the material subjected to the wet-etch process comprises an insulating layer, and the etchant solution comprises an acid solution.

3. The wet-etching methods as claimed in claim 2, wherein the insulating layer comprises a silicon oxide layer ($SiO_2$).

4. The wet-etching method as claimed in claim 2, wherein the insulating layer comprises a silicon nitride layer.

5. The wet-etching method as claimed in claim 2, wherein the acid solution includes one of a $H_3PO_4$ solution, an ammonium hydroxide ($NH_4OH$) solution, and a hydrogen fluoride (HF) solution.

6. The wet-etching method are claimed in claim 1, wherein the material subjected to the wet-etch process comprises a semiconductor layer and the etchant solution comprises an acid solution.

7. The wet-etching method as claimed in claim 6, wherein the semiconductor layer comprises polysilicon.

8. The wet-etching method as claimed in claim 6, wherein the acid solution comprises a $H_2SO_4$ solution.

9. The wet-etching method as claimed in claim 1, wherein the step of calculating the thickness variation value comprises the steps of:
   calculating a density variation value of hydrogen ions in the etchant solution by using the PH variation value;
   calculating a density variation value of the material subjected to the wet-etch process by using the density variation value of the hydrogen ions; and
   calculating the thickness variation value of the material by using the density variation value of the material.

10. The wet-etching method as claimed in claim 9, wherein the PH variation value ($\Delta PH$) and density variation value of the hydrogen ions ($\Delta H$) have a relation of $\Delta H=10^{-\Delta ph}$.

11. The wet-etching method as claimed in claim 9, wherein the thickness variation value is obtained by multiplying the density variation value of the material by a molecular weight of the material, a volume of the wet-etchant solution filling in the bath, the density of the material, and an area of the material to be etched.

12. The wet-etching method as claimed in claim 9, wherein the density variation value of the material is one-half of the density variation value of the hydrogen ions when the material is the silicon oxide layer.

13. The wet-etching method as claimed in claim 9, wherein the density variation value of the polysilicon is one-third of the density variation value or the hydrogen ions when the material is the polysilicon.

14. The wet-etching method as claimed in claim 1, wherein the PH variation value is measured continuously.

15. The wet-etching method as claimed in claim 1, wherein the PH variation value is measured discretely.

16. An etch-ending point measuring method for a wet etch process comprising the steps of:

measuring a PH variation value of a etchant solution during the wet etch process;

calculating a thickness variation value of a material to be etched by using the PH variation value; and determining an etch-ending point when the thickness variation value reaches a preset value.

17. The etch-ending point measuring method as claimed in claim 16, wherein the material to be etched comprises an insulating layer and the etchant solution comprises an acid solution.

18. The etch-ending point measuring method as claimed in claim 17, wherein the insulating layer includes one of a silicon oxide layer and a silicon nitride layer.

19. The etch-ending point measuring method as claimed in claim 17, wherein the acid solution includes one of a $H_3PO_4$ solution, an ammonium hydroxide ($NH_4OH$) solution, and a hydrogen fluoride (HF) solution.

20. The etch-ending point measuring method as claimed in claim 16, wherein the material to be etched, comprises a semiconductor layer and the etchant solution comprises an acid solution.

21. The etch-ending point measuring method as claimed in claim 20, wherein the semiconductor layer comprises polysilicon.

22. The etch-ending point measuring method as claimed in claim 20, wherein the acid solution comprises an $H_2SO_4$ solution.

23. The etch-ending point measuring method as claimed in claim 16, wherein the PH variation value is measured continuously.

24. The etch-ending point measuring method as claimed in claim 16, wherein the PH variation value is measured discretely.

* * * * *

UNITED STATES PATENT AND TRADEMARK OFFICE
CERTIFICATE OF CORRECTION

PATENT NO. : 5,622,636
DATED : April 22, 1997
INVENTOR(S) : Yun Jun HUH et al.

It is certified that error appears in the above-indentified patent and that said Letters Patent is hereby corrected as shown below:

Col. 7, line 15, change "or" to --of--.

Signed and Sealed this

Sixth Day of October, 1998

Attest:

BRUCE LEHMAN

*Attesting Officer*      *Commissioner of Patents and Trademarks*